US010480077B2

United States Patent
Du Bois et al.

(10) Patent No.: US 10,480,077 B2
(45) Date of Patent: Nov. 19, 2019

(54) PEALD APPARATUS TO ENABLE RAPID CYCLING

(71) Applicant: Applied Materials, Inc., Santa Clara, CA (US)

(72) Inventors: Dale R. Du Bois, Los Gatos, CA (US); Jianhua Zhou, Campbell, CA (US); Juan Carlos Rocha-Alvarez, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1403 days.

(21) Appl. No.: 14/186,880

(22) Filed: Feb. 21, 2014

(65) Prior Publication Data

US 2014/0261178 A1    Sep. 18, 2014

Related U.S. Application Data

(60) Provisional application No. 61/780,224, filed on Mar. 13, 2013.

(51) Int. Cl.
*C23C 16/509* (2006.01)
*C23C 16/455* (2006.01)
(Continued)

(52) U.S. Cl.
CPC .................. *C23C 16/509* (2013.01)

(58) Field of Classification Search
CPC ............... H01L 21/67; H01L 21/67098; H01L 21/67109; H01L 21/67115; H01L 21/68721; H01L 21/68735; H01L 21/31116; H01L 21/67069; H01L 21/37109; H01L 21/6719; C23C 16/45555; C23C 16/4558; C23C 16/45591; C23C 16/4585; C23C 16/509; C23C 16/5096; C30B 15/34; C30B 15/14; C30B 15/165; H01J 37/32091; H01J 37/3244; H01J 37/3249; H01J 37/32633; H01J 37/32642; H01J 37/32; H01J 37/32357; H01J 37/32724; H01J 37/32082;
(Continued)

(56) References Cited

U.S. PATENT DOCUMENTS

5,569,356 A * 10/1996 Lenz ................ H01J 37/32009
156/345.34
5,595,627 A * 1/1997 Inazawa ............ H01L 21/31116
216/67
(Continued)

*Primary Examiner* — Kambiz Zand
*Assistant Examiner* — Mirza Israr Javed
(74) *Attorney, Agent, or Firm* — Patterson + Sheridan LLP (57) ABSTRACT

Methods and apparatus for forming thin films are described. A semiconductor processing chamber includes a substrate support, an electrode opposite the substrate support, the electrode having a gas inlet in a peripheral region thereof, and an edge ring disposed around a peripheral region of the substrate support, the edge ring having a first barrier and a second barrier, wherein each of the first barrier and the second barrier mates with a recess in the electrode. The edge ring provides a gas flow path through a processing zone between the substrate support and the electrode that is substantially parallel to the upper surface of the substrate support. The electrode may be powered to enhance formation of a film on a substrate.

21 Claims, 5 Drawing Sheets

(51) Int. Cl.
 *C23C 16/458* (2006.01)
 *H01J 37/32* (2006.01)

(58) Field of Classification Search
 CPC ........... H01J 37/32541; H01J 37/32568; H01J 37/32862; H01J 2237/2001; H01J 37/321; H01J 37/32522; H01J 2237/022; H01J 37/32009
 USPC ................. 118/728–732; 156/345.51–345.55
 See application file for complete search history.

(56) References Cited

U.S. PATENT DOCUMENTS

| | | | | |
|---|---|---|---|---|
| 7,737,035 B1* | 6/2010 | Lind | ................... | C23C 16/4409 |
| | | | | 118/715 |
| 2006/0286820 A1* | 12/2006 | Singh | ................. | C23C 16/0227 |
| | | | | 438/792 |
| 2009/0159002 A1* | 6/2009 | Bera | ................... | H01J 37/3244 |
| | | | | 118/715 |
| 2014/0116335 A1* | 5/2014 | Tsuji | ................. | H01J 37/32862 |
| | | | | 118/620 |

\* cited by examiner

//* PEALD APPARATUS TO ENABLE RAPID CYCLING

CROSS-REFERENCE TO RELATED APPLICATIONS

This application claims benefit of U.S. Provisional Patent Application Ser. No. 61/780,224, filed Mar. 13, 2013, which is incorporated herein by reference.

FIELD

Embodiments described herein generally relate to methods and apparatus for atomic layer deposition. More specifically, embodiments described herein provide methods and apparatus for rapid cycling in an atomic layer deposition process.

BACKGROUND

Atomic layer deposition is a process commonly used to form thin films in the semiconductor industry. A typical process includes positioning a substrate in a reactor and providing a first precursor to the reactor. The first precursor deposits a first species on the substrate surface until the surface is saturated with the first species, after which deposition stops. A second precursor is then provided to the chamber. The second precursor reacts with the first species lining the surface of the substrate until no more of the first species is available to react, after which deposition stops. Such cycles are repeated until a desired thickness of the layer is formed. The chamber is typically purged between precursors to provide controlled layering on the substrate.

The atomic layer deposition process is useful for forming layers having very uniform thickness and composition because the deposition reaction is controlled at the molecular, or atomic, level. The first species only adheres to the substrate surface if an adhesion site is available. Every instance of the first species adheres to the substrate surface in exactly the same way, so that it can participate in the reaction with the second precursor in exactly the same way.

The layer deposited in each deposition operation is monomolecular or monatomic. Typically, the species deposited are no larger than small molecules. Thus, each layer deposited typically has a thickness of 5 Å or less. Each cycle consisting of two precursor operations and two purge operations may take up to a minute to execute. More complex cycles involving more than two precursors may take longer. Forming layers 50-100 Å thick may take 10-20 minutes. To improve rates in ALD processes, one or more precursors may be activated, for example by forming a plasma. The precursor is flowed into the chamber, and then plasma is formed to activate deposition. Plasma is typically discontinued when deposition from the precursor is complete. Fast cycling of gases promotes high throughput. Thus, there is a continuing need for apparatus and methods for fast cycling in PEALD processes.

SUMMARY OF THE INVENTION

Embodiments described herein include a semiconductor processing chamber having a substrate support, an electrode opposite the substrate support, the electrode having a gas inlet in a peripheral region thereof, and an edge ring disposed around a peripheral region of the substrate support, the edge ring having a first barrier and a second barrier, wherein each of the first barrier and the second barrier mates with a recess in the electrode. The edge ring provides a gas flow path through a processing zone between the substrate support and the electrode that is substantially parallel to the upper surface of the substrate support. The electrode may be powered to enhance formation of a film on a substrate.

A plurality of high speed valves may be coupled to the gas inlet to provide rapid switching of precursors and/or reactants into the gas inlet.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
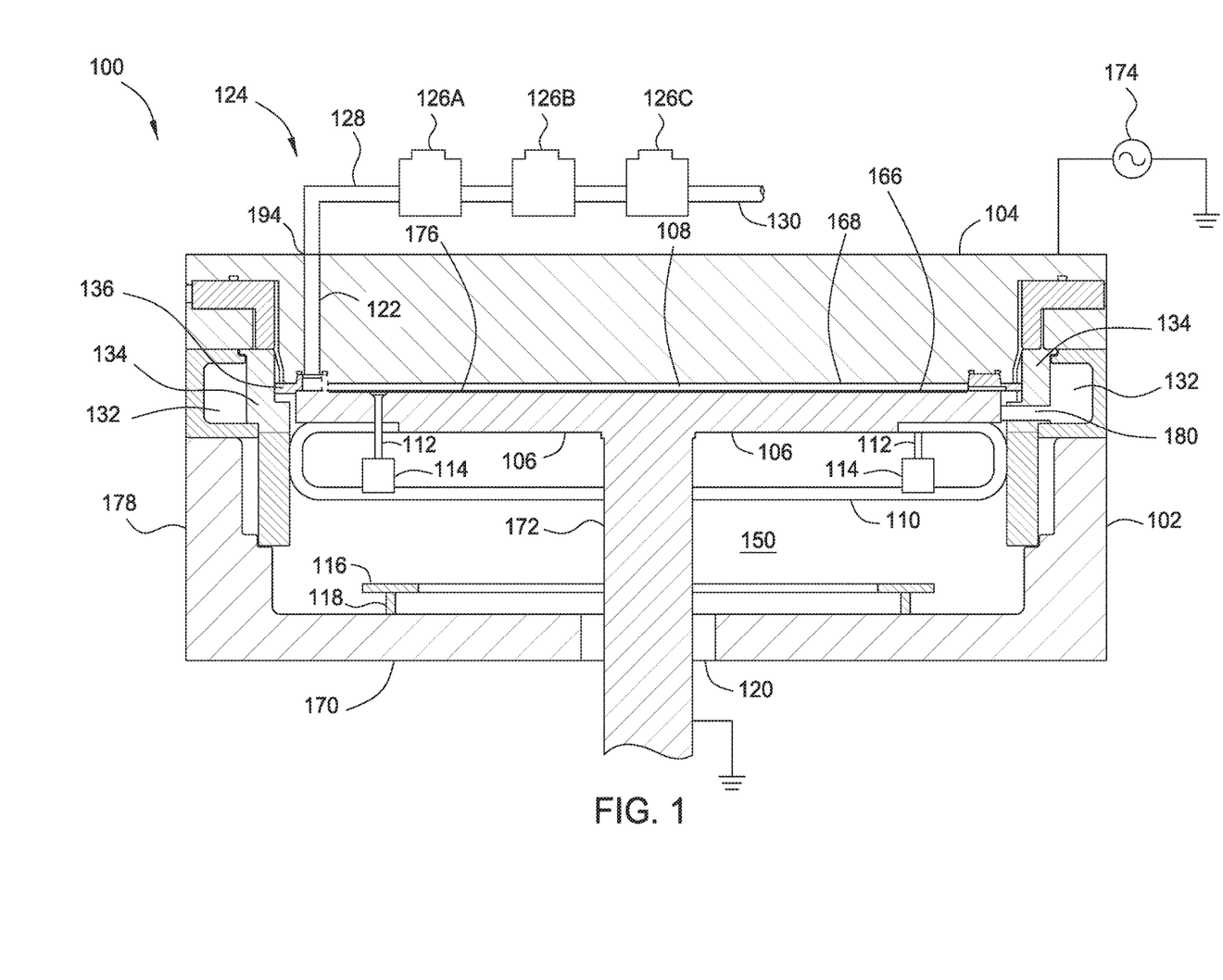
FIG. 1 is a cross-sectional view of a processing chamber according to one embodiment.

FIG. 1 is a cross-sectional view of a processing chamber 100 according to one embodiment. The processing chamber 100 has a chamber body 102 and a chamber lid 104 that couples to the chamber body 102 to define an interior 150. A substrate support 106 is disposed in the interior 150 of the chamber 100. An upper surface 166 of the substrate support 106 and a lower surface 168 of the chamber lid 104 define a processing region 108 in which a substrate disposed in a substrate contact area 176 on the upper surface 166 of the substrate support 106 is exposed to a processing environment.

Substrates enter and exit the processing chamber 100 through a substrate passage 110 in the chamber body 102. In the cross-sectional view of FIG. 1, the substrate passage 110 is behind the cross-section plane, in the "back" of the chamber 100. The substrate support 106 is movable along a longitudinal axis, for example a vertical axis, of the chamber 100 to position the substrate support 106 alternately in a substrate handling position, with the upper surface 166 of the substrate support 106 proximate the substrate passage 110, and a substrate processing position, with the upper surface 166 of the substrate support 106 proximate the lower surface 168 of the chamber lid 104. In the view of FIG. 1, the substrate support 106 is shown in the substrate processing position. When the substrate support 106 is located in the substrate processing position, a distance between the upper surface 166 of the substrate support 106 and the lower surface 168 of the chamber lid 104 is about 2 mm to about 8 mm. A shaft 172 of the substrate support 106 typically extends through an opening 120 in a lower wall 170 of the chamber body 102 and couples to a lift mechanism (not shown) to actuate movement of the substrate support 106.

A substrate elevator 112 is disposed through the substrate support 106. The substrate elevator 112 has a base 114 that contacts an actuator 116 disposed in a lower area of the interior 150 of the chamber 100. The actuator 116 is supported from the lower wall 170 by a support member 118. The actuator 116 may be an annular member, such as a ring, and the support member 118 may be an annular protrusion from the actuator 116. The actuator 116, the support member 118, or both may alternately be segmented. For example, either or both may be a segmented annular member, or the actuator 116 may be a pad, post, or spindle positioned to engage the base 114 of the substrate elevator 112.

The support member 118 maintains the actuator 116 in a substantially parallel relation to the upper surface 166 of the substrate support 106. When the substrate support 106 is moved from the processing position to the substrate handling position, the base 114 of the substrate elevator 112 contacts the actuator 116, causing the substrate elevator 112 to protrude through the upper surface 166 of the substrate support 106 and lift a substrate disposed thereon above the upper surface 166 for access by a substrate handling robot (not shown) through the substrate passage opening 110. Only two substrate elevators 112 are visible in the view of FIG. 1, but a typical embodiment will have three or more substrate elevators 112 distributed to provide stable stationing for substrate handling.

The chamber lid 104 may be an electrode, and may be coupled to a source of RF power 174. If the chamber lid 104 is an electrode, the chamber lid 104 will typically include a conductive material. The chamber lid 104 may be entirely or substantially made of a conductive material, or may be coated with a conductive material to any convenient degree. If the chamber lid 104 is used as an electrode, the lower surface 168 of the chamber lid 104 will be conductive to provide RF coupling into the processing region 108 proximate the upper surface 166 of the substrate support 106. In one embodiment, the chamber lid 104 is aluminum.

A gas manifold 124 is coupled to the chamber lid 104 at a port 194. Process gases are delivered to the chamber through a gas line 128. A plurality of high speed valves 126A-C control flow of gases through the gas line 128 into the chamber 100. The high speed valves may be ALD valves, and in some embodiments may be capable of opening or closing in less than 1 second, and in some cases less than 0.25 seconds. A precursor line 130 is coupled to one of the high speed valves 126A-C. The other high speed valves may be used to join other precursor lines, not visible in FIG. 1, to deliver gases through the gas line 128. Operation of the high speed valves enables fast switch of gas flows as needed for chamber operations, such as ALD deposition cycles.

The chamber lid 104 has a gas inlet 122 located in a peripheral region of the chamber lid 104 and in fluid communication with the port 194 and the gas manifold 124. The gas inlet 122 may be located outside the substrate contact area 176 of the substrate support 106. An edge ring 136 is disposed around a peripheral region of the substrate support 106. The edge ring 136 may be an annular member having an inner dimension and an outer dimension. The inner dimension of the edge ring 136 may be substantially the same as a dimension of the substrate contact area 176 such that a substrate disposed on the substrate support nests inside the edge ring 136, as shown in FIG. 1. The inner dimension of the edge ring 136 may also be larger than the dimension of the substrate contact area 176. The inner dimension of the edge ring 136 may also be smaller than the substrate contact area 176 so that a portion of the edge ring 136 extends over an edge of the substrate. The edge ring 136 of FIG. 1 rests on the substrate support 106 when the substrate support 106 is in the processing position. Thus, the substrate support 106 also supports the edge ring 136 when in the processing position.

A pumping plenum 132 is located in a side wall 178 of the chamber body 102 proximate the processing position of the substrate support 106. The pumping plenum 132 is an annular passage around the processing region 108 where processing gases are evacuated from the processing region 108. A liner 134 separates the pumping plenum 132 from the processing region 108. The liner 134 has an opening 180 that allows process gases to flow from the processing region 108 into the pumping plenum 132. The opening 180 is typically located below the upper surface 166 of the substrate support 106 when the substrate support 106 is in the processing position.

Figure 2A:
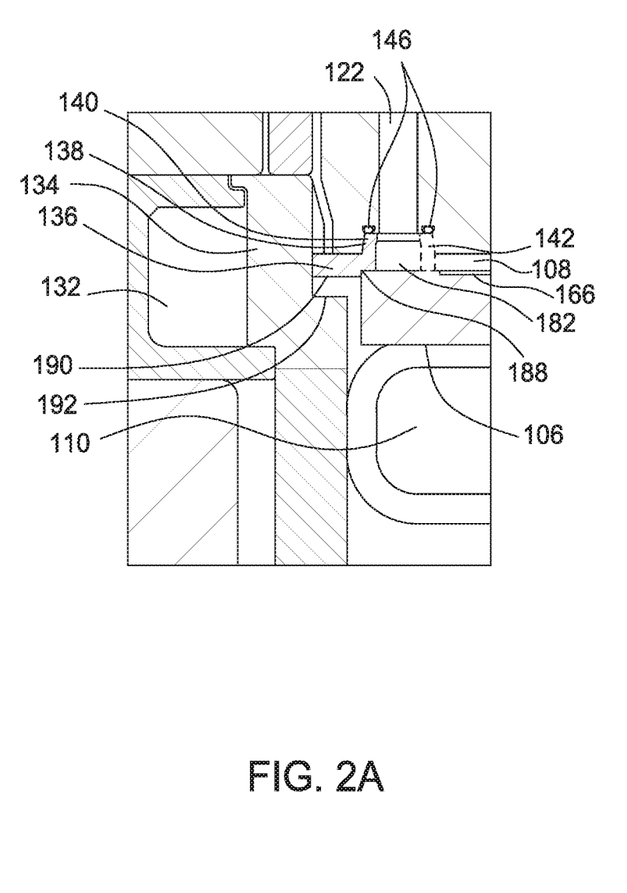
FIGS. 2A and 2B are detailed views of portions of the chamber of FIG. 1.

FIG. 2A is a detailed view of a portion of the apparatus of FIG. 1. The substrate support 106 and the gas inlet 122 are visible in the view of FIG. 2A. The edge ring 136 has a first barrier 138 and a second barrier 142, each of which extend away from the rest of the edge ring 136. The first barrier 138 and the second barrier 142 extend at least partly around the edge ring 136 and define an inlet channel 182 that registers with the gas inlet 122. Gas flows through the gas inlet 122 into the channel 182 and into the processing zone 108 through openings 212 formed in the second barrier 142. The gas flows across a substrate disposed on the substrate support 106 in a substantially laminar fashion. The first barrier 138 prevents gas flow around the edge of the substrate support 106.

The first barrier 138 mates with a first recess 140 formed in the lower surface 168 of the electrode 104, and the second barrier 142 mates with a second recess 144 formed in the lower surface 168 of the electrode 104. The two recesses 140, 142 are formed on opposite sides of the gas inlet 122, and help seal the channel 182 so gas does not escape. Each of the recesses 140, 144 has a seal member 146, such as an o-ring, to seal the interface between the barriers 138, 142 and the recesses 140, 144.

Figure 2B:
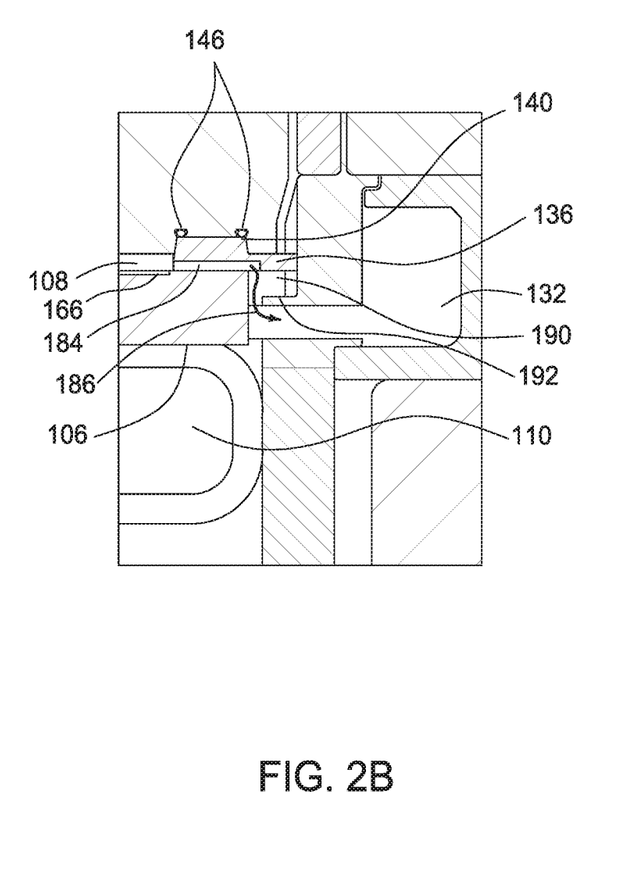

FIG. 2B is a detailed view of another portion of the apparatus of FIG. 1. The view of FIG. 2B is of the edge ring at a point opposite the view of FIG. 2A. The recesses 140, 144 and the sealing members 146 are visible. A gas outlet channel 184 allows gas flowing across the upper surface 166 of the substrate support 106 to flow over the edge of the substrate support 106 into the opening 180 and the pumping plenum 132, as shown by arrow 186.

When the substrate support 106 is in the processing position, the edge ring 136 rests on the substrate support 106. Referring again to FIG. 2A, the edge ring 136 has a contact point 188 where the edge ring 136 contacts the substrate support 106. As shown in FIG. 2A, the contact point 188 may be a notch in the edge ring 136 that mates with a corner or shoulder of the substrate support 106. The contact point 188 is not visible in FIG. 2B because the contact point 188 is not continuous around the full extent of the edge ring 136 so that gas may flow off the edge of the substrate support 106 through the outlet channel 184.

When the edge ring 136 engages with the electrode 104, the edge ring 136 forms a minimum volume reaction space around the substrate consisting of a space less than about 10 mm directly above the substrate. For a 300 mm circular substrate, the reaction volume is no more than about 225 mL, promoting fast switching of gases for an ALD process.

When the edge ring 136 disengages from the electrode 104 and the substrate support 106, the substrate may be accessed, removed through the substrate passage 110, and then replaced.

An extension 190 of the edge ring 136 extends radially outward of the substrate support 106 and provides a means for the edge ring 136 to be supported above the substrate support 106 on a support shelf 192 of the liner 134 as the substrate support 106 moves into the substrate handling position proximate the substrate passage 110. When the substrate support 106 is in the processing position, the extension 190 is spaced apart from the support shelf 192 by a gap of about 0.1 mm to about 5 mm. As the substrate support 106 moves to the substrate handling position, the extension 190 engages the support shelf 192, and the edge ring 136 stops moving while the substrate support 106 continues to the substrate handling position. When the substrate support 106 moves from the substrate handling position to the processing position, the substrate support 106 engages the edge ring 136 at the contact point 188 and then the edge ring 136 moves with the substrate support 106. When the substrate support 106 reaches the processing position, the barriers 138, 142 engage the recesses 140, 144 to seal the inlet channel 182.

Figure 3:
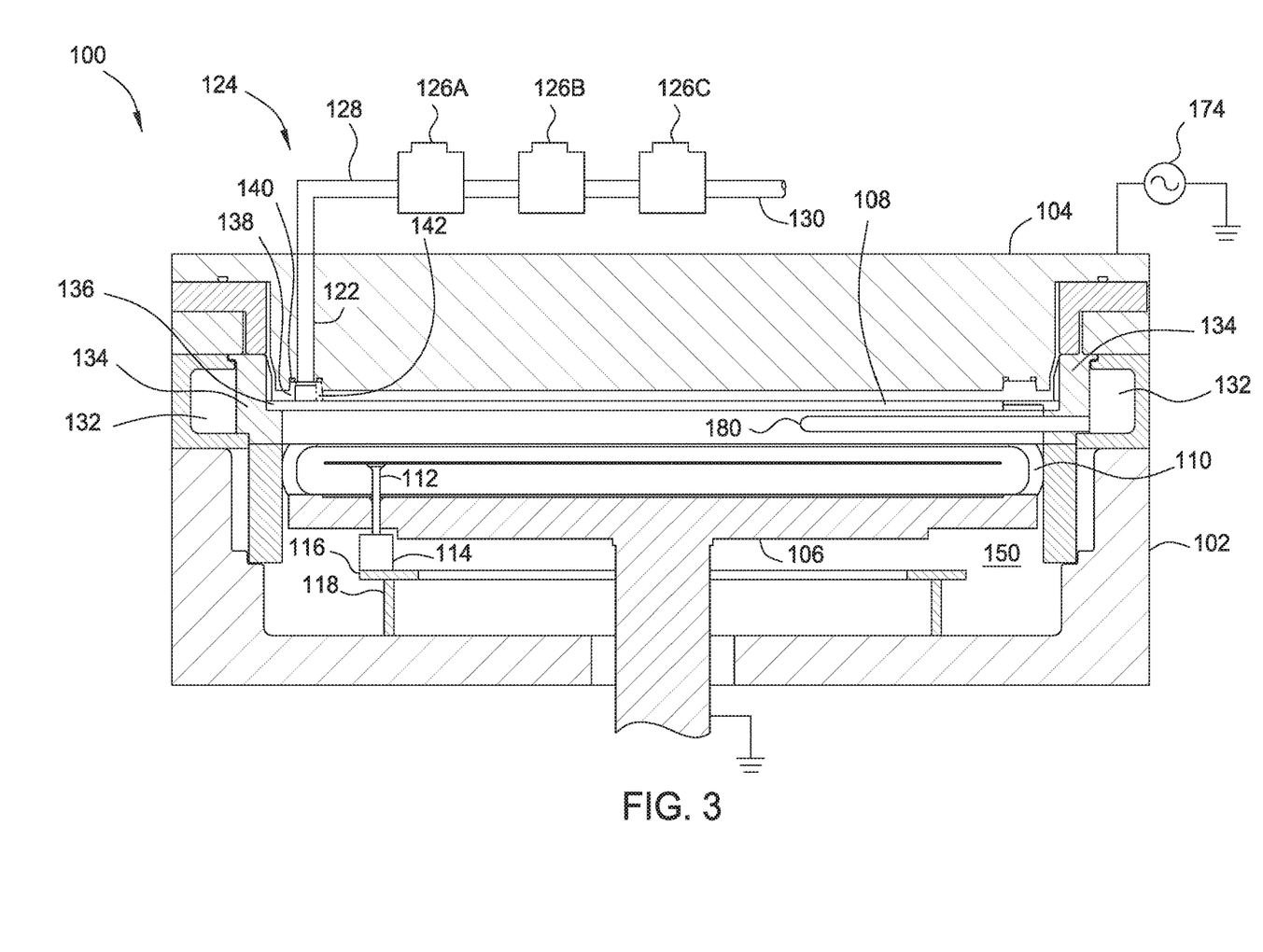
FIG. 3 is a cross-sectional view of the processing chamber of FIG. 1 in another configuration.

FIG. 3 is a cross-sectional view of the processing chamber of FIG. 1 with the substrate support 106 in the substrate handling position. The edge ring 136 is shown resting on the liner 134, as described above, with the edge ring 136 spaced apart from the electrode 104. The barriers 138, 142 are disengaged from the recesses 140, 144, and the substrate elevator 112 is extended by operation of the actuator 116 on the base 114, so the substrate is spaced apart from the substrate support 106 for movement through the substrate passage 110. In the view of FIG. 3, the opening 180 is visible extending in an angular fashion partway around the "back" of the chamber 100.

Figure 4:
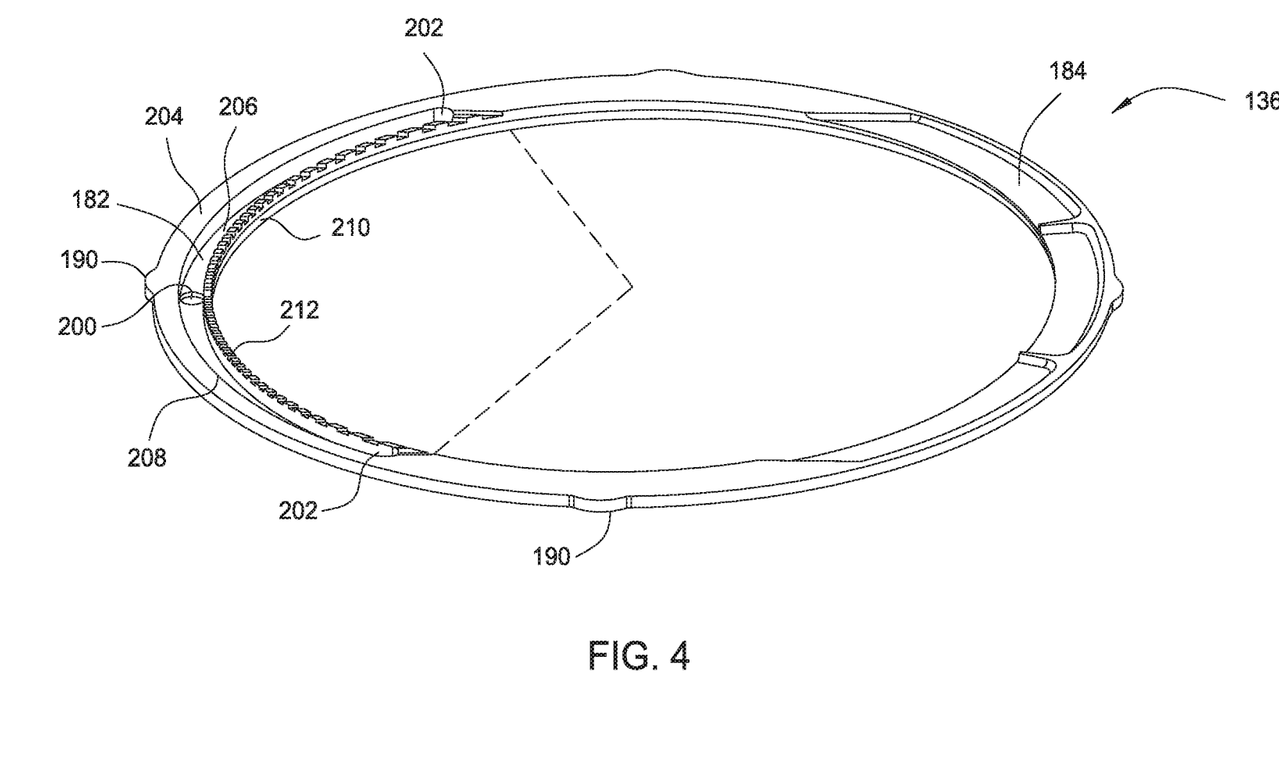
FIG. 4 is a perspective view of an edge ring according to another embodiment.

FIG. 4 is a perspective view of the lower surface of the edge ring 136 of FIGS. 1-3 showing the gas flow features thereof. The inlet channel 182 and outlet channel 184 are visible. A port 200 in the inlet channel 182 registers with the gas inlet 122 (FIGS. 1-3) to maintain fluid communication between the gas inlet and the inlet channel 182. The inlet channel 182 extends partway around the circumference of the edge ring 136, and in the embodiment of FIG. 4 subtends an angle θ that is selected to produce a gas flow field across the substrate support 106 (FIGS. 1-3) that substantially covers the substrate contact area 176 of the substrate support 106. The angle θ may be any convenient angle, but is typically between about 90° and about 140°, such as about 120°.

The inlet channel 182 has a substantially constant width from the port 200 to either extremity 202 of the channel. The inlet channel 182 has a depth, defined as the distance from a surface 204 of the extension 190 to a floor 206 of the inlet channel 182, measured in a direction perpendicular to the surface 204, that increases from the port 200 to either extremity 202. The increase in depth may be substantially linear with linear distance along the inlet channel 182. The increasing depth profile of the inlet channel 182 toward either extremity 202 encourages distribution of gas from the port 200 toward the extremities 202, promoting uniform distribution of gas to the flow field emerging from the edge ring 136.

The inlet channel 182 has an outer first barrier 208 and an inner second barrier 210, in which a plurality of openings 212 are formed to provide gas flow into the processing zone 108 (FIGS. 1-3) and across the substrate support 106. The openings 212 are oriented to provide a substantially laminar, unidirectional, planar gas flow across a substrate disposed on the substrate support 106. As noted above, the edge ring 136 rests on the substrate support 106 when the substrate support is in the processing position, so the channel 182 is enclosed by the outer first barrier 208, the substrate support 106, and the inner second barrier 210 with openings 212. Gas thus flows from the gas inlet 122 through the port 200, along the inlet channel 182 and through the openings 212 to reach the processing zone 108.

Figure 5:
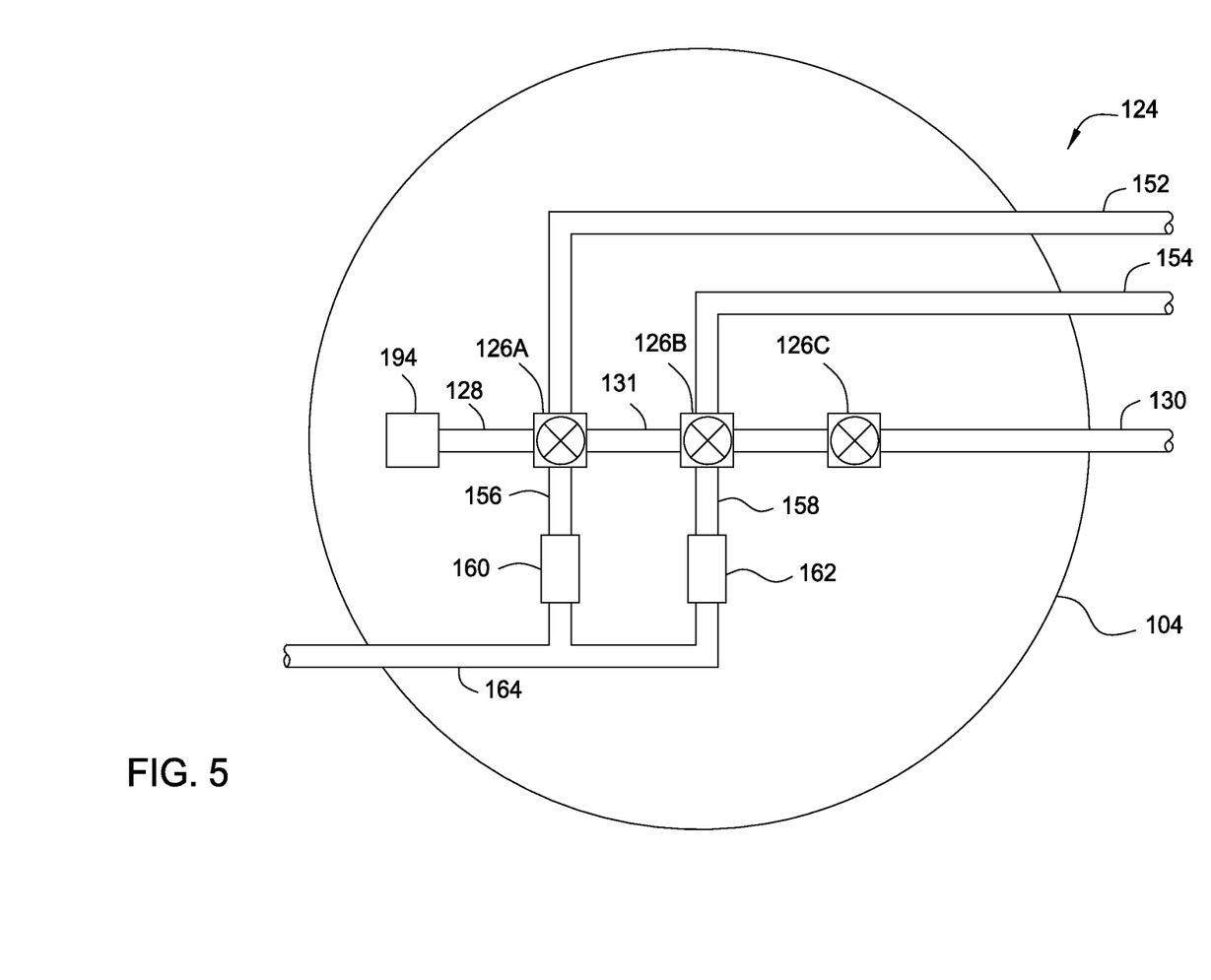
FIG. 5 is a top view of the processing chamber of FIG. 1.

FIG. 5 is a top view of the processing chamber 100 of FIG. 1. The chamber lid 104 is visible with the port 194 into the gas inlet 122 (FIG. 1). The gas manifold 124 is shown with the precursor line 130 coupled to the high speed valve 126C. A second precursor line 152 and a third precursor line 154 are coupled to the other high speed valves 126A, 126B, respectively. The process gases are delivered to the port 194 through the gas line 128. A first divert line 156 couples the high speed valve 126A to a first divert valve 160. A second divert line 158 couples the high speed valve 126B to a second divert valve 162. A divert exhaust line 164 couples to the divert valves 160, 162 to carry gas away from the gas manifold 124.

The high speed valves 126A, 126B are four-way valves that, when operated, direct one inlet stream to one or another outlet while constantly flowing another inlet stream through the valve. In the case of the high speed valve 126B, precursors flowing through the third precursor line 154 may be directed to a blend line 131 or to the second divert line 158, depending on the setting of the high speed valve 126B, while precursors flowing through the precursor line 130 flow through the high speed valve 126B to the blend line 131. Thus, the high speed valve 126B may be a divert valve. In the case of the high speed valve 126A, precursors flowing through the second precursor line 152 may be directed to the gas line 128 or to the first divert line 156, depending on the setting of the high speed valve 126A, while precursors flowing through the blend line 131 flow through the high speed valve 126A to the gas line 128. Thus, the high speed valve 126A may be a divert valve. Using the high speed valves 126A, 126B, precursors may be individually directed to flow into the chamber 100 through the port 194, or may be diverted around the chamber through the divert exhaust line 164.

High speed valves are useful in such a configuration because precision deposition processes are best performed when flows of precursors and purge gases are switched quickly with minimal transition. Undesired blends of precursors are minimized, and time spent lining up the various precursors is also minimized. It should be noted that any number of precursor lines may be added to the gas manifold 124 by adding a four-way high speed valve, such as the valves 126A, 126B, between the high speed valve 126 and the high speed valve 126C, connecting a precursor line to the additional high speed valve, and connecting a divert line and divert valve from the additional high speed valve to the divert exhaust line 164.

The chamber 100 may be used to perform a plasma-enhanced ALD process. A purge gas may be directed through the precursor line 130, a first precursor may be directed through the second precursor line 152, and a second precursor may be directed through the third precursor line 154. The purge gas may be blended with a reagent, if desired, to perform an ALD process using three precursors.

When using two precursors, the precursors may be alternately provided to the chamber through the port 194 using the high speed valves 126A, 126B while constantly flowing purge gas through the high speed valve 126C. The first precursor may be provided to the port 194 by opening the high speed valve 126A to perform a first half-reaction that deposits the first precursor on available sites of a substrate in the chamber 100. The first precursor may then be diverted to the first divert line 156 by closing the high speed valve 126A, and the second precursor may be directed to flow into the chamber by opening the second high speed valve 126B to perform a second half-reaction in which the second precursor reacts with the first precursor deposited on the substrate. The second high speed valve 126B may then be closed, and the cycle repeated, alternately opening the high speed valves 126A, 126B until a layer of desired thickness is formed on the substrate. Purge gas is constantly flowed through the precursor line 130 into the chamber while the high speed valves 126A, 126B are switched.

RF power may be applied to the chamber lid 104 using the RF source 174 (FIG. 1), if desired, to activate one or more of the precursors during any half-reaction.

If desired, one or more precursors may be provided in a blend with a purge gas through the precursor line 130, and one or more precursors may be provided through the second precursor line 152 and the third precursor line 154. In such a configuration, it is preferred that the precursor blended with the purge gas is a precursor that does not react under normal circumstances, but may react when activated by RF power. In such an embodiment, the precursor and purge gas blend provided through the precursor line 130 acts as a carrier gas for a first precursor delivered through the second precursor line 152 for a first partial reaction, and then the first precursor is diverted while RF is applied to the precursor and purge gas blend to perform a second partial reaction. The precursor blended with the purge gas is activated by the RF power and reacts with the first precursor deposited on the substrate. A second precursor may be sequentially, concurrently, or alternately provided through the third precursor line 154 to perform a third partial reaction, if desired.

The terms "upper", "lower", "top", and "bottom", as may be encountered throughout this description, are descriptions of directions relative to the orientation of the apparatus being described, and are not intended to limit the apparatus so described to any absolute orientation.

While the foregoing is directed to embodiments of the present invention, other and further embodiments of the invention may be devised without departing from the basic scope thereof, and the scope thereof is determined by the claims that follow.

We claim:

1. A semiconductor processing chamber, comprising:
   a substrate support;
   an electrode opposite the substrate support, the electrode having a gas inlet in a peripheral region thereof;
   an edge ring disposed around a peripheral region of the substrate support, the edge ring having an outer first barrier extending at least partly around the edge ring, which is an unbroken barrier, and an inner second barrier extending at least partly around the edge ring, which is an intermittent barrier, wherein each of the first barrier and the second barrier mates with and enters into a respective recess in the electrode, and wherein the first barrier and the second barrier define an inlet channel; and
   a seal member disposed in each of the recesses.

2. The semiconductor processing chamber of claim 1, wherein the first barrier and the second barrier extend around the edge ring and a distance between the first barrier and the second barrier is substantially constant.

3. The semiconductor processing chamber of claim 2, wherein the second barrier is located radially inward of the first barrier.

4. The semiconductor processing chamber of claim 3, wherein the second barrier has intermittent openings formed therethrough.

5. The semiconductor processing chamber of claim 1, further comprising a pumping plenum disposed in a side wall of the chamber proximate a processing position of the substrate support, and a liner separating the pumping plenum from the substrate support, wherein the liner has an opening located opposite the gas inlet of the electrode.

6. The semiconductor processing chamber of claim 5, wherein the substrate support is movable between the processing position and a substrate handling position, and the liner has an extension that supports the edge ring spaced apart from the substrate support when the substrate support is at the substrate handling position.

7. The semiconductor processing chamber of claim 6, wherein the first barrier and the second barrier extend around the edge ring, the second barrier is located radially inward of the first barrier, and the second barrier has at least one opening located substantially opposite the opening in the liner.

8. The semiconductor processing chamber of claim 1, further comprising a source of RF power coupled to the electrode.

9. The semiconductor processing chamber of claim 8, further comprising a gas manifold coupled to the gas inlet, the gas manifold comprising a plurality of high speed valves.

10. The semiconductor processing chamber of claim 9, wherein the substrate support is movable between a processing position proximate the electrode and a substrate handling position, and a substrate passage between an upper surface of the substrate support and a lower surface of the electrode, when the substrate support is in the processing position, is about 2 mm to about 8 mm.

11. A semiconductor processing chamber, comprising:
    a substrate support;
    an electrode opposite the substrate support, the electrode having a gas inlet in a peripheral region thereof;
    an edge ring disposed around a peripheral region of the substrate support, the edge ring having an outer first barrier, which is an unbroken barrier, and an inner second barrier, which is an intermittent barrier, wherein each of the first barrier and the second barrier mates with and enters into a respective recess in the electrode, and the substrate support is movable between a processing position proximate the electrode and a substrate handling position; and
    a seal disposed member in each of the recesses.

12. The semiconductor processing chamber of claim 11, further comprising a pumping plenum disposed in a side wall of the chamber proximate the processing position of the substrate support, and a liner separating the pumping plenum from the substrate support, wherein the liner has an opening located opposite the gas inlet of the electrode.

13. The semiconductor processing chamber of claim 12, wherein the second barrier has at least one opening proximate the gas inlet, and the substrate support and the electrode define a flow path from the at least one opening in the second barrier to the opening in the liner.

14. The semiconductor processing chamber of claim 13, wherein the opening in the liner is located below an upper surface of the substrate support when the substrate support is located in the processing position.

15. The semiconductor processing chamber of claim 14, further comprising a substrate passage formed in the side wall of the chamber, and the substrate passage is located below the pumping plenum.

16. A semiconductor processing chamber, comprising:
a chamber body;
a chamber lid coupled to the chamber body, the chamber lid having a conductive lower surface coupled to a source of RF energy, a gas inlet in a peripheral region thereof, and two recesses in the lower surface and on opposite sides of the gas inlet, the chamber lid and chamber body defining an interior;
a substrate support disposed in the interior; and
an edge ring disposed on the substrate support at a peripheral region thereof, the edge ring enclosing a substrate contact area of the substrate support, wherein the edge ring mates with and enters into the two recesses, the edge ring has a port that fluidly couples the gas inlet to a channel between an outer first barrier, which is an unbroken barrier, and an inner second barrier, which is an intermittent barrier, of the edge ring, the second barrier is located radially inward of the first barrier, the second barrier has a plurality of openings that fluidly couple the channel to the chamber interior, and the channel has a depth that increases with distance from the port, wherein the substrate support, the lower surface of the chamber lid, and the edge ring define a minimum reaction volume.

17. The semiconductor processing chamber of claim 16, further comprising a gas manifold coupled to the gas inlet, the gas manifold comprising a plurality of high speed valves.

18. The semiconductor processing chamber of claim 17, further comprising a seal member in each of the two recesses.

19. The semiconductor processing chamber of claim 1, further comprising an inlet channel defined by the first barrier and the second barrier, and subtending an angle of less than 140°, wherein the substrate support is movable between a processing position proximate the electrode and a substrate handling position, wherein the edge ring comprises a notch that mates with a corner of the substrate support when the substrate support is in the processing position.

20. The semiconductor processing chamber of claim 16, wherein the minimum reaction volume is no more than about 225 mL.

21. A semiconductor processing chamber, comprising:
a substrate support;
an electrode opposite the substrate support, the electrode comprising:
a gas inlet in a peripheral region thereof;
a pair of recesses on a surface facing the substrate support; and
a seal member disposed in each of the recesses; and
an edge ring disposed around a peripheral region of the substrate support, the edge ring comprising:
a notch that mates with a corner of the substrate support when the substrate support is in a processing position, the notch and the corner defining a contact point;
an outer first barrier, which is an unbroken barrier;
an inner second barrier, which is an intermittent barrier, wherein the first barrier and the second barrier mate with and enter into the pair of recesses in the electrode; and
an inlet channel defined by the first barrier and the second barrier, that registers with the gas inlet of the electrode and subtends an angle of less than 140°.

* * * * *